United States Patent [19]

Lang et al.

[11] 3,997,226

[45] Dec. 14, 1976

[54] MOUNTING AND CONTACT ASSEMBLY FOR INTERCONNECTION OF DISPLAY AND LOGIC CIRCUIT ELEMENTS IN DIGITAL ELECTRONIC CALCULATORS

[76] Inventors: Roger D. Lang, 5175 Thorntree, Irvine, Calif. 92664; Philip J. Thomas, 3952 Patrick Henry Place, Agoura, Calif. 91301; John A. McAllister, 26661 Las Tunas, Mission Viejo, Calif. 92675

[22] Filed: Jan. 27, 1975

[21] Appl. No.: 544,396

[52] U.S. Cl. ........................ 339/17 LM; 339/17 M; 339/176 MP

[51] Int. Cl.$^2$ ........................ H05K 1/07

[58] Field of Search .......... 339/17 R, 17 L, 17 LM, 339/17 M, 17 LC, 17 C, 176 MP, 75 MP; 317/101 DH

[56] References Cited

UNITED STATES PATENTS

| | | | |
|---|---|---|---|
| 2,911,609 | 11/1959 | Burtt et al. | 339/176 MP X |
| 3,567,998 | 3/1971 | Ammerman | 339/176 MP X |
| 3,601,746 | 8/1971 | Teagno | 339/17 R X |
| 3,732,531 | 5/1973 | Bouley | 339/176 MP X |
| 3,772,634 | 11/1973 | Hennessey et al. | 339/75 MP X |
| 3,853,380 | 12/1974 | Baker | 339/91 R |
| 3,922,051 | 11/1975 | Reynolds | 317/101 DH X |
| R27,540 | 1/1973 | Kinkaid | 339/176 MP |

*Primary Examiner*—Roy Lake
*Assistant Examiner*—Mark S. Bicks
*Attorney, Agent, or Firm*—Knobbe, Martens, Olson, Hubbard & Bear

[57] ABSTRACT

A mechanical and electrical interconnecting mechanism for assembly of a display printed circuit board at a predetermined angle relative a main logic printed circuit board in a hand-held microelectronic calculator. The mechanism permits combined mounting of each of the printed circuit boards within the calculator case and allows wave soldering of the display board to the main board.

15 Claims, 4 Drawing Figures

FIG. 1
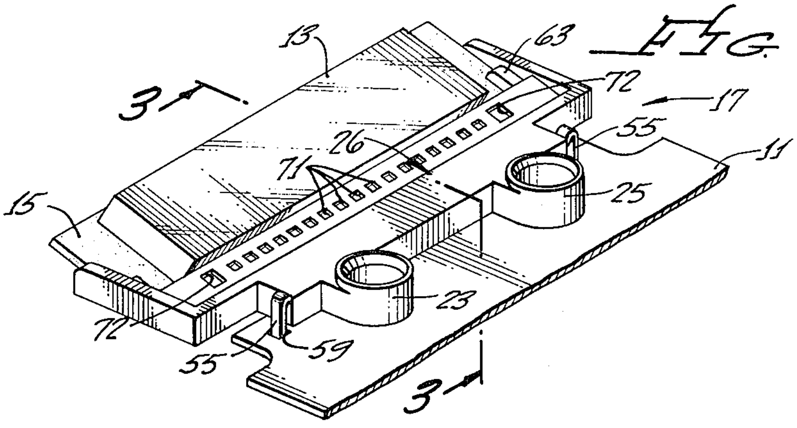
FIG. 2
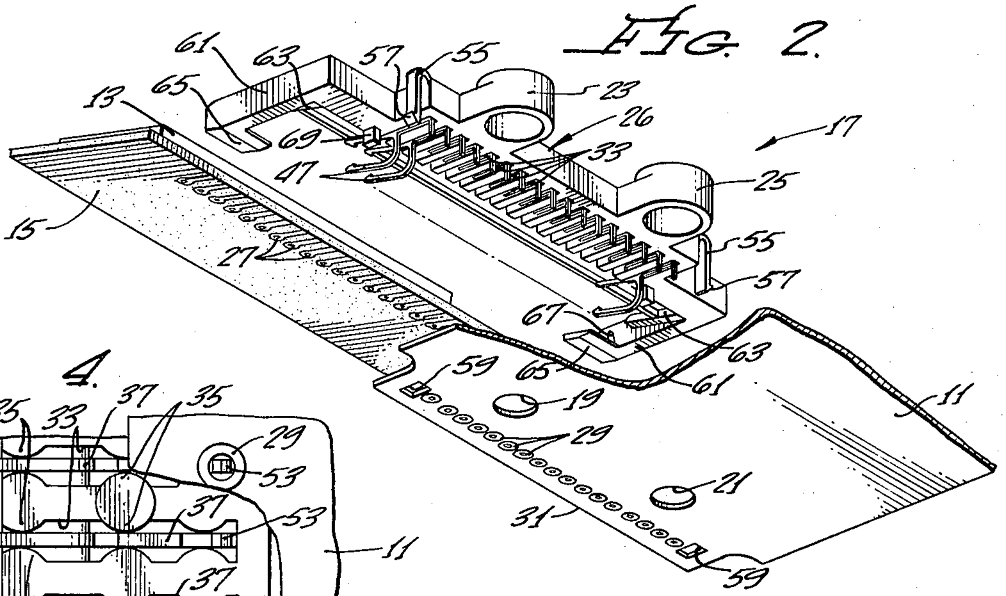
FIG. 4
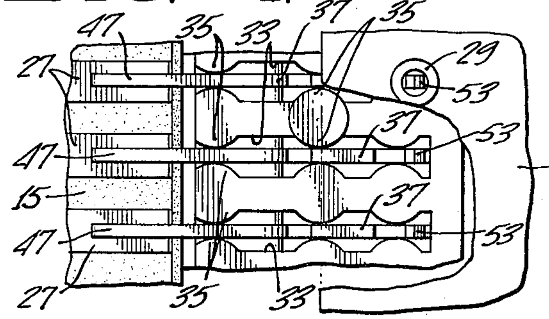
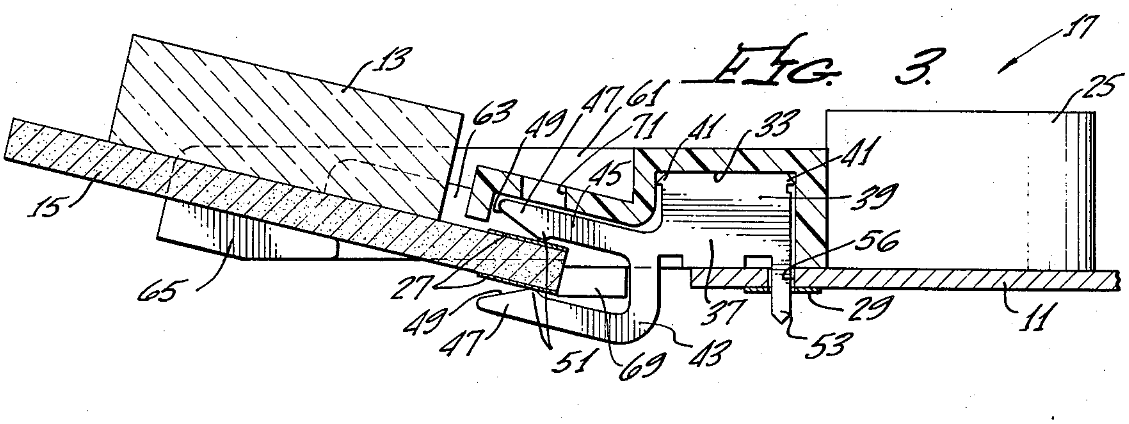
FIG. 3

MOUNTING AND CONTACT ASSEMBLY FOR INTERCONNECTION OF DISPLAY AND LOGIC CIRCUIT ELEMENTS IN DIGITAL ELECTRONIC CALCULATORS

BACKGROUND OF THE INVENTION

Prior to the present invention, the display elements, typically light emitting diode (LED) digits, were separately mounted to the case of a hand-held calculator, or a display printed circuit board mounting a plurality of LED digits was separately mounted within the calculator housing or case. The individual interconnections between the main circuit board, which typically included power, control, driving and logic circuitry for the calculator, and the display elements were conventionally accomplished by hand soldering of individual terminals on the main circuit board to individual terminals on either the LED digits or the LED printed circuit board. As a consequence of the independent mounting of the display electronics and the logic circuitry, and the required semipermanent hand soldering of these elements, the assembly was costly and incurred a relatively high risk of loss during the assembly operation of the LED digits or display assembly. Such loss required the hand soldering removal of the digits if the logic board was to be salvaged, so that the cost of such repair was often prohibitive. Likewise, the replacement during manufacture or service maintenance of the display assembly required a high risk hand soldering operation which was relatively expensive. In addition, the prior art provides no adequate means for mounting the display digits or printed circuit board at an accurately controlled angle relative the main logic board. Since LED digits have relatively limited viewing angles, the mechanical mounting within the calculator case of these elements is critical.

Due to the hand soldering techniques used in conventional calculator assembly, the overall size of the interconnection is bulky and therefore presents an undesirable restraint upon the case configuration.

SUMMARY OF THE INVENTION

The present invention alleviates these difficulties of the prior art by providing an interconnection assembly for mechanically and electrically coupling a display printed circuit board to the main logic circuit board of a hand-held microelectronic calculator. The interconnecting assembly is constructed to permit wave soldering to both of the printed circuit boards rather than the hand soldering techniques previously used. The wave soldering assembly allows efficient, low cost installation and replacement of the LED display component and substantially lowers the risk of loss of the display components during assembly. The interconnection assembly is constructed to substantially reduce the bulk and profile of the electronic package so that the calculator case size can be kept at a minimum. In addition, the interconnecting assembly provides mechanical mounting with accurate alignment and registration of the display circuit board so that the display digits can be maintained in a position consistent with the limited viewing angles thereof.

These advantages are realized through an interconnect assembly which comprises an insulating base element including apertures for receiving mounting screws for mounting both the interconnect assembly and the main logic printed circuit board. The base member is formed of semi-resilient dielectric material and provides interference-fit mechanical mounting for a plurality of contact elements. These electrodes include a projecting solder terminal for permitting wave soldering to the main logic printed circuit board and a pair of resilient, opposed contact members for receiving terminals on the display printed circuit board. The resilient contact elements serve to temporarily mount the display circuit board prior to wave soldering and permit accurate alignment of the display circuit board at an inclined angle relative the main logic board. In addition, resilient members are used to temporarily mount the base element to the main logic circuit board prior to wave soldering.

During a single wave soldering process, the multiple electrodes of the base member are soldered to each of the terminals on the display board and the main logic circuit board, respectively, to form a rigid assembly. The base member includes alignment supports and guides to assure that the circuit boards maintain a proper relative alignment during wave soldering, and these elements further serve to support the display circuit board during installation in the calculator case to prohibit damage to the display elements. The present invention additionally provides for a simple installation of the entire electronics package into the microelectronic calculator case through the use of screws passing through both the main logic circuit board and the base element of the interconnect assembly.

These and other advantages of the present invention are best understood through a reference to the drawings, in which:

FIG. 1 is a perspective view of the interconnect assembly of the present invention attached to a main logic circuit board and a display circuit board of a hand-held calculator;

FIG. 2 is a perspective view showing the underside of the interconnect assembly of the present invention exploded from the main logic circuit board and display logic circuit board;

FIG. 3 is a sectional view of the assembly of FIG. 1 taken along lines 3—3 thereof; and FIG. 4 is a bottom plan view of a portion of the interconnect assembly showing the elements which mount the electrodes thereof.

DETAILED DESCRIPTION OF THE PREFERRED EMBODIMENT

Microelectronic calculators typically include two primary circuit elements. The first is a logic circuit board 11 which supports power supplies, control circuitry, a microelectronic chip which serves as the digital logic element of the calculator and driving circuitry for interfacing between the logic element and the display. The second primary electronic element is a display 13 which typically comprises a plurality of LED digits commonly mounted on a display printed circuit board 15. Each of these elements is designed to be mounted within a hand-held calculator case (not shown) which includes multiple switches for inputting signals to the logic circuitry. In order for the circuit boards 11 and 15 and the display element 13 to be relatively shock proof within the hand-held case and to insure accurate alignment between these elements, the interconnect assembly 17 of the present invention is designed to make the necessary electrical connections between the boards 11 and 15 and to mechanically mount the display circuit board 15 relative to the logic circuit board 11. In addition, the interconnect assembly 17 is designed to permit wave soldering of the electrical interconnections between the circuit boards 11 and 15 in order to decrease the cost of assembly while increasing the quality of the electrical connections.

The logic circuit board 11 includes a pair of apertures 19 and 21 which, when the elements are assembled, are aligned with a pair of mounting bosses 23 and 25, respectively, which project from a main body portion 26 of the interconnect assembly 17. These mounting bosses 23, 25 and apertures 19, 21 are designed to receive a pair of screws (not shown) which are threaded into the case of the hand-held calculator to rigidly mount both the interconnect assembly 17 and the main logic circuit board 11. The display circuit board 15 is, in turn, mechanically mounted on the interconnect assembly 17 so that each of the elements 15, 17 and 11 are maintained in a predetermined mechanical alignment when installed in the case of the hand-held calculator.

The display circuit board 15 includes a plurality of electrically conductive contact pads 27 spaced along an edge 29 of the board 15 which is designed for placement into the interconnect assembly 17. These contact pads 27 are typically formed as part of the printed circuit on the board 15 and may be provided on the lower side of the board 15, the upper side of the board 15, or both. In the embodiment shown in the drawings, and particularly FIG. 3 thereof, the contact pads 27 are shown on both the upper and lower sides of the board 15. In a similar manner, the main logic circuit board 11 includes a plurality of contact pads 29 spaced along an edge 31 of the board 11 which is designed to be mounted on the interconnect assembly 17. The contact pads 27 and 29 are equally spaced along the respective boards 11 and 15 and are designed to be interconnected in a one-to-one relationship by the interconnect assembly 17. The contact pads 29 are formed as a part of the printed circuit on the main logic circuit board 11 and typically exist only on the lower side thereof.

The interconnect assembly 17, as best shown in FIGS. 2 and 4, includes a plurality of parallel elongate slots 33. These slots 33 include pairs of opposed nodules 35 along the sides thereof which abut the sides of contact elements 37 to accurately position these elements 37. The interconnect assembly 17 is typically formed of a semi-resilient plastic material, such as glass-filled polyester, which is sufficiently flexible to afford the nodules 35 some resilience while assuring relatively high strength for the main body portion 26. The nodules 35 therefore permit some variation in the thickness of the contact elements 37 while still providing accurate alignment thereof. The contact elements 37 are flat, conductive, typically metallic elements which may be stamped, for example, from sheet metal. At the upper edge of the elements 37, as particularly shown in FIG. 3, there is included a mounting tab 39 which includes a pair of outwardly projecting tines 41. The distance between the apex of the tines 41 is slightly larger than the length of the elongate slots 33 so that, when a contact element 37 is forced into an elongate slot 33 between the nodules 35, the tines 41 will grip the ends of the slot 33 to secure the contact element 37 within the slot 33. The assembly of the interconnect assembly 17 is accomplished by placing each of the contact elements 37 adjacent the respective slots 33 and pressing the elements 37, as with a die, into the slots 33. The contact elements 37 are therefore electrically insulated from one another, being supported within the dielectric material of the interconnect assembly 17.

Referring again specifically to FIG. 3, the contact elements 37 each include a U-shaped projecting contact assembly 43 comprising upper and lower opposed, elongate contact members 45 and 47. Each of these contact members 45, 47 includes a beveled interior end portion 49 extending to a contact protrusion 51. The beveled extremities 49 are designed to permit a sliding placement of the contact pads 27 between the upper and lower contact members 45 and 47. The distance separating the protrusions 51 is designed to be slightly less than the thickness of the display circuit board 15 so that, as the circuit board 15 and its associated contact pads 27 is slid between the contact members 45 and 47, the protrusions 51 will establish a good electrical contact with the display circuit board 15. In addition, the resilience of the U-shaped assembly 43 serves to mechanically hold the display circuit board 15 within the contact elements 37 prior to soldering. The extension of the contact protrusions 51 beyond the inner surfaces of the upper and lower contact members 45 and 47 additionally provides sufficient clearance within the U-shaped assembly 43 to allow the display circuit board 15 to be mounted at a variety of angles while still maintaining adequate electrical and mechanical interconnection between these elements. Thus, the mechanical supporting and positioning elements of the interconnect assembly 17, which will be described below, can be made to maintain the display circuit board 15 at a variety of predetermined angles while still utilizing an identical contact element 37 without degradation in the performance of the interconnect assembly 17.

At the other end of the contact element 37, opposite the U-shaped assembly 43, a protruding solder terminal 53 is designed to extend below the main body of the contact element 37. As shown in FIG. 3, this solder terminal 53 is designed to extend through an aperture 56 in the logic circuit board 11 which is centrally located within one of the plural logic board contact pads 29. The contact element 37 therefore provides an electrical interconnection between the contact pads 27 on the display circuit board and the contact pads 29 on the main logic circuit board 11, while simultaneously providing a biased mechanical hold on the display circuit board 15 to hold this board 15 in position relative the interconnect assembly 17.

In order to hold the main logic circuit board 11 adjacent the interconnect assembly 17 to assure protrusion of the solder terminals 53 through the circuit board 11, a pair of retaining elements 55, best shown in FIGS. 1 and 2, are formed as a part of the intereconnect assembly 17. These elements 55 are formed as elongate arms integral with and depending from the main body portion 26. Since the interconnect assembly 17 is made of semiresilient plastic material, these retaining elements will normally be held in a position wherein the main elongate arm thereof is perpendicular to the plane of the interconnect assembly 17. At the lower extremity of the retaining elements 55, a hook or barb element 57 is formed as an integral part. These elements 55 are designed to interconnect with a pair of apertures 59 cut through the main logic circuit board 11 at opposite ends of the row of contact pads 29. During placement of the main logic board 11 onto the interconnect assembly 17, the retaining elements 55 operate first as an indexing or aligning means, the barbed ends 57 being placed within the apertures 59. This placement properly aligns each of the solder terminals 53 with the associated apertures 56 in the main logic circuit board 11. The logic board 11 may then be pressed onto the interconnect assembly 17 to press the solder terminals 53 through the related apertures 56 and contact pads 29. Simultaneously, the barbed ends 57 operate as camming surfaces to bend the retaining elements 55 so that the barbed ends 57 will pass through the apertures 59. Due to the resilience of the retaining elements 55, the barbed ends 57 will then snap under the square apertures 59 to lock the interconnect assembly 17 to the logic board 11. This mechanical interconnection serves to hold the interconnect assembly 17 and circuit board 11 together until wave soldering is accomplished. It will be recognized that, once the solder terminals 53 have been wave soldered to the contact elements 29, this soldering serves as a rigid mechanical interconnection as well as an electrical interconnection, so that the retaining elements 55 are no longer required. It is thus not necessary that the retaining elements 55 be strong enough to provide this mechanical bond during use of the microelectronic calculator, but only that these elements 55 be sufficiently strong to temporarily maintain the circuit board 11 and interconnect assembly properly aligned during a wave soldering operation. In addition, as was previously described, the main mounting screws for the electronic calculator pass through both the mounting bosses 23, 25 of the interconnect assembly 17 and the apertures 19, 21 of the logic board 11 to provide further mechanical support for each of these elements during use.

Since the LED display elements 13 of microelectronic calculators have critical and limited viewing angles, it is important that the display circuit board 15 be maintained at a proper angle, both prior to mounting of the electronic elements within the calculator case and during use. It is, however, inconvenient and costly to separately mount the display elements 13 or display board 15 within the case to assure this angle. The present invention therefore provides for a mechanical alignment of the display element 13 through a direct mounting from the mounting bosses 23, 25 and their associated screws. In order to accomplish this alignment, the interconnect assembly 17 is designed to be slightly wider than the display circuit board 15 and includes a pair of laterally protruding support brackets 61. These support brackets 61 are designed to lie on opposite sides of the display circuit board 15 so that the board 15 may be positioned therebetween. Formed integrally with the support brackets 61, and on the inner surface thereof, are upper alignment brackets 63 and lower alignment brackets 65. The upper alignment brackets are formed at the angle at which the display circuit board 15 is to be mounted, while the lower alignment brackets 65 have an upper surface (FIG. 3) which is beveled to receive a display board 15 at this angle. The display circuit board 15 is therefore accurately registered within the upper and lower guides 63 and 65 and mechanically restrained within the U-shaped assembly 43 to provide accurate mechanical alignment. The angular displacement between the display circuit board 15 and the main logic circuit board 11 is typically 13.5° to provide adequate viewing of the display element 13. The lower alignment bracket 65, because of the semi-resilient material of the overall interconnect assembly 17, is slightly resilient so that the display circuit board 15 may be biased slightly between the upper and lower alignment brackets 63, 65. In addition, a small nodule (not shown) may be formed on the upper surface on the lower alignment brackets 65 in order to provide some tolerance for varying thicknesses of the display circuit boards 15. Similarly, a pair of small nodules 67 (FIG. 2) may be provided on the inside surfaces of the support brackets 61 to provide tolerance for various widths of display circuit boards 15, and to self-center such boards 15 regardless of their width.

The display circuit board 15 is attached to the interconnect assembly 17 by laterally sliding the board 15 between the support brackets 61 and the upper and lower alignment guides 63 and 65 until the edge of the circuit board 15 contacts the U-shaped connecting assembly 43. Further sliding pressure will engage the contact pads 27 on the edge of the circuit board 15 within the U-shaped assembly 43, the upper and lower beveled ends 49 of this element operating as cams to spread the U-shaped assembly 43 around the edge of the circuit board 15 so that, once the display board 15 is completely engaged, the U-shaped assembly 43 is biased to maintain the board 15 in position. A pair of protruding stops 69 limit the extent to which the display board 15 may be pressed into the interconnect assembly 17.

A plurality of observation apertures 71 permit a viewing of the contact between the upper contact members 45 and the contact pads 27 on the display board 15, so that the assembly operator can view each of these connections to assure that the upper contact members 45 are properly aligned on the display circuit board 15. In addition, a pair of observation apertures 72 permit viewing of the contact between the display board 15 and the stops 69 so that the assembly operator can assure that the board 15 is fully inserted. Once the entire assembly of the display circuit board 15, interconnect assembly 17 and main logic circuit board 11 have been mechanically and electrically interconnected as described above, the entire assembly may be wave soldered from below to coat the solder terminals 53 and contact pads 29 with a solder joint, and to simultaneously coat the lower contact members 47 and contact pads 27 with a solder joint. The space between adjacent contact elements 37 is sufficient to assure that bridging between these elements by solder will not occur during the wave soldering operation. During final assembly into the calculator case, it will be noted that the U-shaped contact assembly 43 extends below the main logic circuit board 11, and a recess must be formed in the calculator case to accommodate this element and the protruding solder terminal 53. Other embodiments may be designed in which the U-shaped assembly 43 is positioned above the main logic circuit board 11 by redesigning the contact element 37 to place the U-shaped assembly 43 at the upper extremity of the tab 39. In either case, the solder terminal 53 and U-shaped interconnect assembly 43 will protrude below their associated circuit boards slightly so that wave soldering will produce a solder joint between these elements and the contact pads on the circuit board.

Once the wave soldering operation has been completed, the assembly may be mounted within the calculator case by placing screws in the apertures 23 and 25 and connecting these screws to the calculator case. No further mounting of the display circuit board 15 or display elements 13 is required, but it is typical to include further circular apertures within the main logic circuit board 11 to mount the other end thereof to the calculator case. The ability to wave solder the assembly, along with the low cost, low risk mechanical mounting of the display board 15 and its associated display element 13 substantially reduces the cost of the entire assembly while increasing the reliability thereof.

What is claimed is:

1. An interconnecting assembly for mechanically and electrically connecting a display printed circuit board to a logic printed circuit board in a microelectronic display device, comprising:

a semi-resilient dielectric body;

a plurality of planar contact means mounted on said body;

each contact means having a first solder contact extending in a first direction from said contact means for insertion through an aperture in a respective solder contact on the face of a first one of said printed circuit boards;

each contact means also having a second contact extending in a direction which is at a slight angle from perpendicular to said first direction for receiving one edge of the second of said printed circuit boards by disposing said second board at a slight angle to the plane of said first board and sliding said second board edgewise in its own plane toward said first board to engage the second contact of each contact means with a respective contact on the second board and to place an edge of said second board substantially at the plane of said first board.

2. An interconnecting assembly as defined in claim 1 and further comprising:

guide means on said body disposed laterally from said contact means for engaging said second board adjacent an edge perpendicular to said one edge to position said second board at said angle relative to said first board and to guide said second board as it is slid into engagement with said second contacts.

3. An interconnecting assembly as defined in claim 2 wherein said mechanical guide means maintain said display printed circuit board at substantially a 13½° angle relative said logic printed circuit board.

4. An interconnecting assembly as defined in claim 1 and further comprising:

guide means on said body disposed laterally on opposite sides of said plurality of contact means for engaging said second board adjacent its two side edges perpendicular to said one edge to position said second board at said angle relative to said first board and to guide said second board as it is slid into engagement with said contacts;

said means also including means engaging said two side edges to laterally align the respective contacts on said second board and on said body.

5. An interconnecting assembly as defined in claim 4 wherein said guide means are sufficiently resilient to bias said second board to the desired position, while flexing to accommodate tolerances in the width and thickness of said second board.

6. An interconnecting assembly for mechanically and electrically connecting a display printed circuit board to a logic printed circuit board in a microelectronic hand-held display device, comprising:

a semi-resilient dielectric body having a plurality of parallel slots in its bottom each of said slots forming an opening in the bottom of said body and an opening in a side of said body adjacent the bottom;

a separate electric conductor mounted in each of said slots;

each of said conductors being a flat plate lying substantially in a single plane, the planes of said conductors being parallel to one another, each of said conductors including a solder contact terminal depending in said single plane down from opening in the bottom of said body for insertion down through a respective one of a plurality of apertures in the face of the logic printed circuit board to be soldered to a respective solder contact terminal on the bottom of said logic board with said body disposed above said board;

each of said conductors also including U-shaped contact in said single plane receiving an edge of the display board with the display board disposed in a plane inclined at a slight angle to the logic board, said U-shaped contact extending away from said opening in said side of said body.

7. An interconnecting assembly as defined in claim 6 and further comprising:

each of said electric conductors being a flat plate having a central portion between said contacts for receiving an edgewise force transverse to the openings of the U-shaped contact to force fit the conductor means into its slot in the body to avoid damage to the contacts.

8. An electrical connector as defined in claim 7 wherein said dielectric body and said electric conductors are the sole means of support of one of said pair of printed circuit boards.

9. An interconnecting assembly as defined in claim 6 and further comprising:

a pair of resilient arms depending from said body and each having a hook on its end for passing downward through a respective pair of apertures in the logic board to align each of said solder contact terminals with its respective aperture and then to snap beneath the logic board and retain the body in position on the logic board;

the hooks of said arms being the only dielectric portions of said body disposed beneath said logic board to facilitate wave soldering of said solder contact terminals.

10. An interconnecting assembly as defined in claim 6 wherein said U-shaped contact is formed of flat sheet metal and wherein said U-shaped contact includes elongate opposed arms having beveled extremities to permit said display printed circuit board to be resiliently placed between said arms of said U-shaped contact.

11. An interconnecting assembly as defined in claim 6 wherein said main body portion includes nodules on the sides of said slots, said nodules reducing the width of said slots so that the flat faces of said flat plate conductors are resiliently biased between said nodules when placed within said slots.

12. A mechanical and electrical connector assembly as defined in claim 6 wherein a portion of said U-shaped contact extends below said logic printed circuit board.

13. A mechanical and electrical connector assembly as defined in claim 6 wherein said U-shaped contacts comprise:

a pair of arms normally spaced from one another by a dimension which is less than the thickness of said display printed circuit board, said arms being positioned on opposite sides of said display printed circuit board and being sufficiently resilient to permit said display printed circuit board to be resiliently held between said arms.

14. A mechanical and electrical connector assembly as defined in claim 6 wherein said dielectric body includes plural apertures for permitting viewing of said plurality of electrical conductors.

15. An electrical and mechanical connector assembly for interconnecting a main logic printed circuit board to a display printed circuit board in a hand-held microelectronic display device, comprising:

a main body portion formed of semi-resilient dielectric material including a plurality of spaced, parallel elongate slots forming openings on two adjacent sides of said body and an aperture for receiving a mounting screw;

a pair of support arms projecting from said main body portion, said support arms comprising:

upper and lower guide elements for abutting the upper and lower surfaces of said display printed circuit board, said lower guide element being resilient to provide tolerance for circuit boards of various thickness, said guide elements positioned to hold said display printed circuit board at an angle relative said main body portion;

a pair of retaining means for securing said main body portion to said main logic printed circuit board, comprising:

a resilient arm depending from said main body portion; and a hook member at the end of said resilient arm, said hook member designed to pass through said main logic printed circuit board and to snap beneath said logic circuit board due to the bias of said resilient arm; and a plurality of flat metal contact elements each lying substantially in a single plane, said elements mounted in said elongate slots, said elements comprising:

a connecting tab for mounting said elements in said elongate slots, said tab including a tine for prohibiting removal of said tab from said slot;

a U-shaped extension on one side of said tab and extending from said opening on one of said adjacent sides of said body for resiliently holding one edge of said display printed circuit board between the arms of said U-shaped extension; and a solder terminal depending from another side of said tab and extending from said opening on the other of said adjacent sides of said body for contacting said main logic circuit board.

* * * * *